(12) United States Patent
Suh et al.

(10) Patent No.: US 11,049,960 B2
(45) Date of Patent: Jun. 29, 2021

(54) GALLIUM NITRIDE (GAN) BASED TRANSISTOR WITH MULTIPLE P-GAN BLOCKS

(71) Applicant: TEXAS INSTRUMENTS INCORPORATED, Dallas, TX (US)

(72) Inventors: Chang Soo Suh, Allen, TX (US); Sameer Prakash Pendharkar, Allen, TX (US); Naveen Tipirneni, Frisco, TX (US); Jungwoo Joh, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/294,687

(22) Filed: Mar. 6, 2019

(65) Prior Publication Data
US 2020/0287033 A1    Sep. 10, 2020

(51) Int. Cl.
| | |
|---|---|
| *H01L 29/872* | (2006.01) |
| *H01L 29/205* | (2006.01) |
| *H01L 29/778* | (2006.01) |
| *H01L 29/66* | (2006.01) |
| *H01L 29/20* | (2006.01) |
| *H01L 29/423* | (2006.01) |
| *H01L 21/308* | (2006.01) |

(Continued)

(52) U.S. Cl.
CPC ........ *H01L 29/778* (2013.01); *H01L 21/0254* (2013.01); *H01L 21/308* (2013.01); *H01L 29/2003* (2013.01); *H01L 29/41725* (2013.01); *H01L 29/42312* (2013.01); *H01L 29/66462* (2013.01)

(58) Field of Classification Search
None
See application file for complete search history.

(56) References Cited

U.S. PATENT DOCUMENTS

| | | |
|---|---|---|
| 2007/0205433 A1 | 9/2007 | Parikh et al. |
| 2013/0175580 A1 | 7/2013 | Suh et al. |
| | (Continued) | |

FOREIGN PATENT DOCUMENTS

| | | |
|---|---|---|
| WO | 2008151138 A1 | 12/2008 |

OTHER PUBLICATIONS

Kaneko et al., "Current-collapse-free Operations up to 850 V by GaN-GIT utilizing Hole Injection from Drain," Proceedings of the 27th International Symposium on Power Semiconductor Devices & IC's, May 10-14, 2015, Kowloon Shangri-La, Hong Kong, 4 p.

(Continued)

*Primary Examiner* — Joseph C. Nicely
*Assistant Examiner* — Lamont B Koo
(74) *Attorney, Agent, or Firm* — Jacqueline J. Garner; Charles A. Brill; Frank D. Cimino (57) ABSTRACT

In some examples, a gallium nitride (GaN)-based transistor, comprises a substrate; a GaN layer supported by the substrate; an aluminum nitride gallium (AlGaN) layer supported by the GaN layer; a p-doped GaN structure supported by the AlGaN layer; and multiple p-doped GaN blocks supported by the AlGaN layer, each of the multiple p-doped GaN blocks physically separated from the remaining multiple p-doped GaN blocks, wherein first and second contours of a two-dimensional electron gas (2DEG) of the GaN-based transistor are at an interface of the AlGaN and GaN layers.

16 Claims, 10 Drawing Sheets

(51) Int. Cl.
*H01L 29/417* (2006.01)
*H01L 21/02* (2006.01)

(56) References Cited

U.S. PATENT DOCUMENTS

2014/0026324 A1    1/2014  Gilao
2016/0035853 A1*   2/2016  Kaneko ............... H01L 29/0619
                                                           257/194
2020/0027872 A1*   1/2020  Boles ................... H01L 29/155

OTHER PUBLICATIONS

Patent Cooperation Treaty Search Report, dated May 14, 2020, PCT/US2020/020862.

* cited by examiner

GALLIUM NITRIDE (GAN) BASED TRANSISTOR WITH MULTIPLE P-GAN BLOCKS

BACKGROUND

Gallium nitride (GaN)-based semiconductor devices deliver characteristics that are better than silicon-based devices. GaN-based semiconductor devices have faster-switching speed and excellent reverse-recovery performance which is critical for low-loss and high-efficiency performance.

SUMMARY

In accordance with one example, a gallium nitride (GaN)-based transistor, comprises a substrate; a GaN layer supported by the substrate; an aluminum nitride gallium (AlGaN) layer supported by the GaN layer; a p-doped GaN structure supported by the AlGaN layer; and multiple p-doped GaN blocks supported by the AlGaN layer, each of the multiple p-doped GaN blocks physically separated from the remaining multiple p-doped GaN blocks, wherein first and second contours of a two-dimensional electron gas (2DEG) of the GaN-based transistor are at an interface of the AlGaN and GaN layers.

In accordance with another example, a gallium nitride (GaN)-based transistor, comprises a substrate; a GaN layer supported by the substrate; an aluminum nitride gallium (AlGaN) layer supported by the AlGaN layer; a p-doped GaN layer supported by the AlGaN layer; a gate contact structure disposed on the p-doped GaN layer; a first drain contact structure disposed on the AlGaN layer; multiple p-doped GaN blocks disposed on the AlGaN layer; multiple second drain contact structures, each of the multiple second drain contact structures physically separated from the remaining second drain contact structures, and each of the multiple second drain contact structures disposed on a different one of the multiple p-doped GaN blocks, wherein each of the multiple second drain contact structures electrically couples to the first drain contact structure; and a source contact structure disposed on the AlGaN layer.

In accordance with another example, a method, comprises obtaining a substrate including a heterostructure; depositing a p-type gallium nitride (GaN) layer on the heterostructure; and selectively etching the p-type gallium nitride (GaN) layer to form a p-type GaN structure in a gate area of a GaN transistor and multiple p-type GaN blocks in a drain area of the GaN transistor.

BRIEF DESCRIPTION OF THE DRAWINGS

For a detailed description of various examples, reference will now be made to the accompanying drawings in which:

FIG. 2(a)-1 depicts top-down views of another illustrative GaN-based transistor that implements the block-based hybrid drain contact structure, in accordance with various examples.

FIG. 2(a)-2 depicts cross-sectional side-view of the GaN-based transistor that implements the block-based hybrid drain contact structure, in accordance with various examples.

FIG. 2(a)-3 depicts cross-sectional side-view of the GaN-based transistor that implements the block-based hybrid drain contact structure, in accordance with various examples.

DETAILED DESCRIPTION

Gallium nitride (GaN)-based devices are designed to include heterostructures that induce a two-dimensional electron gas (2DEG) in such devices. These heterostructures typically include at least two group-III nitride-based layers with different bandgaps. In this disclosure, group-III refers to the third group of elements from the widely known periodic table of elements. In some cases, the heterostructure may include a first group-III nitride layer that, along with nitrogen, includes a group-III element. An example of the first group-III nitride layer is GaN. The heterostructure also includes a second group-III nitride layer that, along with nitrogen, includes two or more group-III elements. For example, the second group-III nitride layer may include aluminum and gallium as the group-III elements and can have a chemical composition of $Al(X)Ga(1-X)N$, where X is the concentration of aluminum. In this heterostructure, the first group-III nitride layer has a narrower bandgap relative to the second group-III nitride layer. Due to this bandgap mismatch, large conduction-band offset, and spontaneous and piezoelectric polarization properties of group-III nitride layers, the highly-mobile 2DEG induces in the heterostructure.

For the sake of illustration, some of the description herein focuses on GaN-based devices, such as GaN-based transistors. However, the disclosure is not limited to transistors and can be applied to other GaN-based devices that include heterostructures. Again, for the sake of illustration, some of the description herein focuses on heterostructures including the first and second group-III nitride layers. However, this disclosure is not limited to such heterostructures and can be applied to other heterostructures that can induce a 2DEG at their interface.

GaN-based transistors can be classified as enhancement mode high electron mobility transistors (e-HEMTs) or depletion mode high electron mobility transistors (d-HEMTs). A gate contact structure is generally positioned between the source and drain contact structures of GaN-based transistors. The architecture of these gate contact structures assists in forming the enhancement and depletion mode devices. Some e-HEMT architecture includes an additional gate contact structure. In some cases, this additional gate contact structure includes a p-doped GaN layer, which is sometimes herein referred to as p-GaN gate contact structure. For example, the GaN layer can be doped using magnesium (Mg) which is an acceptor impurity and makes the GaN layer p-type or p-doped. This layer depletes electrons from the 2DEG under the p-GaN gate contact structure, and an incomplete 2DEG makes e-HEMTs normally-OFF devices. e-HEMTs can be turned ON by applying a positive threshold voltage to the gate contact structure that attracts electrons from the GaN layer and repletes the 2DEG under the gate contact structure turning the e-HEMT ON. On the other hand, d-HEMTs are designed to be normally-ON devices, meaning that the 2DEG is always present between the source and drain contact structures. D-HEMTs are turned OFF by applying a negative threshold voltage to the gate contact structure that depletes electrons from the 2DEG under the gate contact structure.

Compared to silicon-based transistors, GaN-based transistors deliver superior switching characteristics. However, GaN-based transistors suffer from current collapse, which is an undesirable phenomenon that occurs under switching conditions, e.g., when the GaN-based transistor is turned on and off at a high voltage. Current collapse is believed to be caused by electron and/or hole trapping and de-trapping, which appears as a transient and recoverable reduction in the drain current after the application of a high voltage. For the sake of illustration, assume an e-HEMT including Al(X)Ga(1-X)N layer (or "AlGaN layer"), where X is the concentration of aluminum and GaN layer. Further assume that the e-HEMT is in off-state and has the following voltage states: a drain voltage of 600V, a gate voltage below the threshold, and a grounded source voltage. Under this off-state condition, high-energy electrons from the 2DEG are injected towards the top of the AlGaN layer, and the surface states capture the electrons, giving rise to a negatively charged surface. During the on-state condition, e.g., at a drain voltage of 1V, gate voltage above the threshold, and a grounded source voltage; the electrons captured in these surface states are slowly emitted, leading to recovery transients. In other words, during the on-state, the Ron (on-state resistance) increases (as compared to a static on-state) due to the negatively charged surface states. This is because the negatively charged surface states reduce the electron density of the 2DEG and the Ron normalizes to its static on-state value after the electrons captured in the surface states are emitted.

Furthermore, in the off-state condition, the high drain voltage induces large electric fields, which ionizes holes present in the heterostructure between the gate and the drain contact structures or underneath the drain contact structure. These ionized holes are pulled towards the gate and/or source contact structures in the off-state condition. The ionization of holes leave fixed negative charges in the heterostructure, and in the on-state, due to slow neutralization of the fixed negative charges, the remaining fixed negative charges increase the Ron compared to the static on-state due to reduction of the 2DEG density.

Some techniques have been employed to prevent the current collapse phenomenon described above. One such technique includes using a hybrid drain contact structure. The hybrid drain contact structure, in addition to the typical drain contact structure (that forms an ohmic contact), includes a p-type drain contact structure that includes a p-doped GaN layer positioned below an additional drain contact structure forming the p-type drain contact structure. Therefore, the hybrid drain contact structure includes the p-type drain contact structure (or "drain pGaN contact structures") that is coupled to the typical drain contact structure. The hybrid drain contact structure has been demonstrated to neutralize the above-mentioned charged states by injecting holes. However, fabricating such hybrid drain contact structures in normally-off GaN-based transistors (e.g., e-HEMTs) with p-GaN gate contact structure architecture requires two different thicknesses of the first group-III nitride layer (e.g., Al(X)Ga(1-X)N (or AlGaN) layer) below the gate and drain pGaN contact structures. Two different thicknesses are needed for normally-off operation because the AlGaN layer thickness below the p-GaN gate contact structure needs to be thin enough to ensure that the threshold voltage (Vt) is greater than zero, in other words, is positive. In contrast, the AlGaN layer thickness below the p-GaN drain contact structure needs to be thick to prevent p-GaN drain contact structure from depleting the electrons from the 2DEG below it and enable current flow during the on-state. Stated another way, using hybrid drain contact structures results in the 2DEG that is depleted at only one portion during the off state of the e-HEMT. Therefore, implementing the hybrid drain contact structures requires growing AlGaN layer twice to attain different AlGaN layer thicknesses. The additional growth step adds significant costs and reduces throughput because the growth process is done using epitaxial deposition tools, which substantially adds costs in GaN-based manufacturing. Therefore, systems and methods are needed to avoid growing the AlGaN layer twice and appease the current collapse phenomenon.

Accordingly, at least one of the systems disclosed herein is directed towards an enhancement mode normally-off GaN-based device (e.g., transistor) that implements a block-based hybrid drain contact structure. In at least some examples, the GaN-based device, including the block-based hybrid drain contact structure, employs the epitaxial growth process once, thereby saving fabrication costs and appeasing the current collapse phenomenon.

Figure 1A:
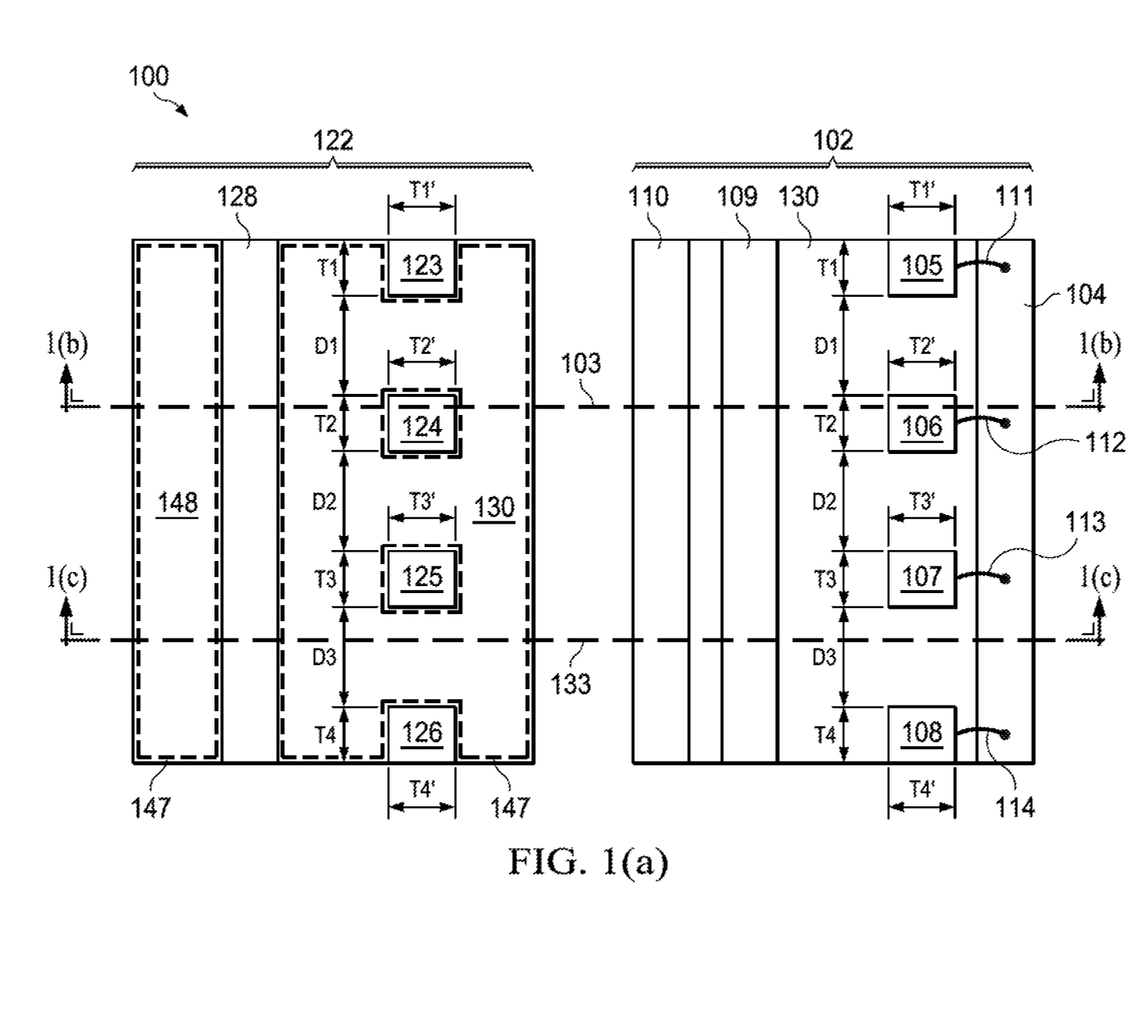
FIG. 1(a) depicts top-down views of an illustrative gallium nitride (GaN)-based transistor that implements a block-based hybrid drain contact structure, in accordance with various examples.

Referring now to FIG. 1(a), an illustrative representation depicting top-down views 102, 122 of a single enhancement mode normally-off GaN-based transistor 100 that implements a block-based hybrid drain contact structure is shown. The modified hybrid drain contact structure improves (e.g., reduces) the current collapse issue. Furthermore, the fabrication of the modified hybrid drain contact structure circumvents the need to have different thicknesses of an AlGaN layer 130, which saves fabrication costs as the epitaxial growth process is performed only once. Briefly refer to FIGS. 1(b), (c); they depict cross-sectional side-views 142, 162 of the single enhancement mode normally-off GaN-based transistor 100 along the lines 103, 133, respectively. The single enhancement mode normally-off GaN-based transistor 100 is hereinafter referred to as GaN-based transistor 100.

The top-down view 102 depicts a source contact structure 110, a gate contact structure 109, drain contact structure 104, and blocks of additional drain contact structures 105, 106, 107, and 108. The blocks of additional drain contact structures (or "blocks of drain contact structures") 105, 106, 107, and 108 are positioned along the drain contact structure 104. Each of the blocks of drain contact structures 105, 106, 107, and 108 couples to the drain contact structure 104 via connecting wires 111, 112, 113, and 114, respectively. From a fabrication perspective, the connecting wires 111, 112, 113, and 114 may be implemented by the metal routing layers disposed above the contact structures. For example, the blocks of drain contact structures 105, 106, 107, and 108 along with the drain contact structure 104 are formed in the metal 0 (MET 0) level, whereas the connecting wires 111, 112, 113, and 114 are formed in the metal 1 (MET 1) level, where the MET 0 level is below the MET 1 level. The example depicted in FIG. 1(a) shows four blocks of drain contact structures. However, in other examples, the number of blocks of drain contact structures may vary.

In some examples, the blocks of drain contact structures 105, 106, 107 and 108 have lengths T1, T2, T3, and T4 respectively. In FIG. 1(a), the lengths T1, T2, T3, and T4 appear to be similar and may lie within a range of 0.1 um-1000 um. In other examples, the lengths T1, T2, T3, and T4 may be unequal. In some examples, the blocks of drain contact structures 105, 106, 107 and 108 have width T1', T2', T3', and T4' respectively. Widths T1', T2', T3', and T4' appear to be similar and may lie within a range of 0.1 um-1000 um, and in other examples, the widths T1', T2', T3', and T4' may be unequal. In some examples, the widths of the drain contact structure 104 may be similar to the widths of the blocks of the drain contact structures 105-108.

Referring now to the top-down view 122, which depicts the layers present in the GaN-based transistor 100 directly underneath the drain contact structures of the top-down view 102. The top-down view 122 depicts a p-doped GaN structure 128 (or p-GaN structure 128) that enables the GaN-based transistor 100 to function in a normally-off (or enhancement) mode. From a fabrication standpoint, the p-GaN structure 128 is positioned under the gate contact structure 109, such that the p-GaN structure 128 contacts the gate contact structure 109. The p-GaN structure 128 enables the transistor 100 to function in the enhancement mode. The top-down view 122 further depicts blocks of p-doped GaN (or p-GaN or pGaN) structures 123, 124, 125, and 126, which, from a fabrication standpoint, are always positioned underneath the blocks of drain contact structures 105, 106, 107, and 108, respectively. The blocks of p-GaN structures 123-126 are sometimes referred to as p-GaN blocks 123-126. In one example, the p-GaN blocks 123, 124, 125, 126, and the pGaN structure 128 are directly supported by the AlGaN layer 130. The term "support" or "supported by" used in this disclosure is intended to mean either an indirect or direct support. Thus, if one layer is supported by another layer, that support may be through a direct support with the other layer or through an indirect support via additional layers.

A combined arrangement of the p-GaN block 123 and the block of drain contact structure 105 forms a block of p-type drain contact structure (this p-type drain contact structure is not expressly notated in FIG. 1(a)). Similarly, a combined arrangement of the p-GaN block 124 and the block of drain contact structure 106 forms a block of p-type drain contact structure 145 (see FIG. 1(b), the cross-sectional side view 142 along the line 103). Similar to the block of p-type drain contact structure 145, a combined arrangement of the p-GaN block 125 and the block of drain contact structure 107 forms a block of p-type drain contact structure (not expressly notated in FIG. 1(a)). Similar to the block of p-type drain contact structure 145, a combined arrangement of the p-GaN block 126 and the block of drain contact structure 108 forms a block of p-type drain contact structure (not expressly notated in FIG. 1(a)).

In the example depicted in FIG. 1(a), the p-GaN blocks 123-126 have lengths T1, T2, T3, and T4, respectively. In some examples, the p-GaN blocks 123-126 have widths T1', T2', T3', and T4', respectively. The lengths and widths of the p-GaN blocks 123, 124, 125, and 126 are shown to be similar to the lengths and widths of the blocks of drain contact structures 105, 106, 107, and 108, respectively. However, in other examples, the lengths and widths of the p-GaN blocks 123, 124, 125, and 126 may not be similar to the lengths and widths of the blocks of drain contact structures 105, 106, 107, and 108, respectively.

The p-GaN blocks 123-126 are depicted to be placed at a finite distance from each other. For example, the blocks 123, 124 are at a first distance, D1, from each other, where D1 is the distance between the lower edge of the block 123 and the upper edge of the block 124. The blocks 124, 125 are at a second distance, D2, from each other, where D2 is the distance between the lower edge of the block 124 and the upper edge of the block 125. Similarly, the blocks 125, 126 are at a third distance, D3, from each other, where D3 is the distance between the lower edge of the block 125 and the upper edge of the block 126. These distances D1, D2, D3, in some examples, are equal. However, in other examples, these distances may be unequal. As noted above, the p-GaN blocks (or p-GaN blocks or pGaN blocks) 123, 124, 125, and 126 are always positioned underneath the blocks of drain contact structures 105, 106, 107, and 108, respectively. Consequently, the distance between the lower and upper edges of the contact structures 105 and 106, respectively, is D1; the distance between the lower and upper edges of the contact structures 106 and 107, respectively, is D2; and the distance between the lower and upper edges of the contact structures 107 and 108, respectively, is D3.

The p-GaN blocks and the blocks of drain contact structures couple to the drain contact layer 104 via connecting wires 111, 112, 113, and 114. The p-GaN blocks, the blocks of drain contact structures, and the drain contact layer 104 are collectively referred to herein as the block-based hybrid drain contact structure (not expressly notated in FIG. 1(a)). A 2DEG 148 is formed near the interface of the GaN layer 143 and the AlGaN layer 130 and is present below the AlGaN layer 130 in between the boundary marked by dotted lines 147. Referring now to the FIGS. 1(b), 1(c), the cross-sectional side views 142, 162, which show the cross-section of the GaN-based transistor 100 along two different lines 103, 133, respectively. The lines 103, 133 show two distinct cross-sectional views of the block-based hybrid drain contact structure; one (along the line 103) that includes the block of p-type drain contact structure 145 formed by the combined arrangement of the p-GaN block 124 and the block of drain contact structure 106; the other (along the line 133) that excludes such combined arrangement.

Figure 1B:
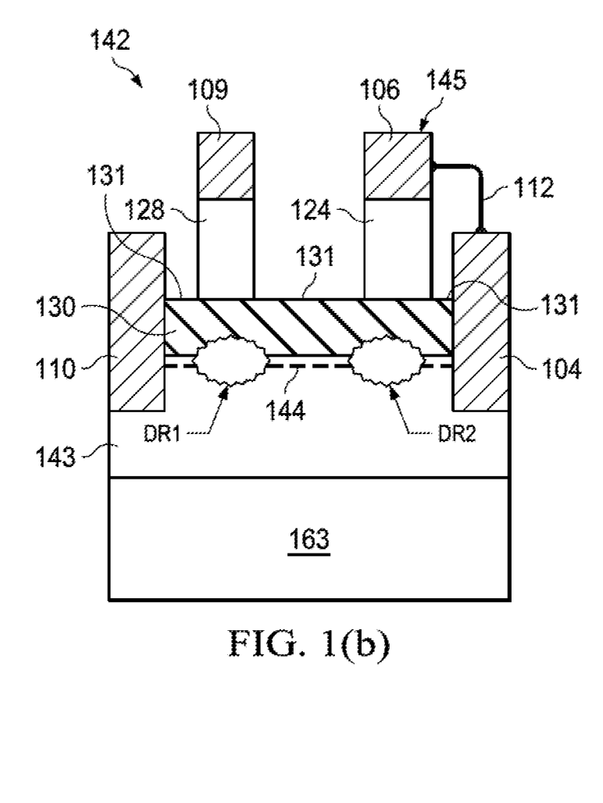
FIG. 1(b) depicts cross-sectional side-view of the enhancement mode normally-off GaN-based transistor, in accordance with various examples.
Figure 1C:
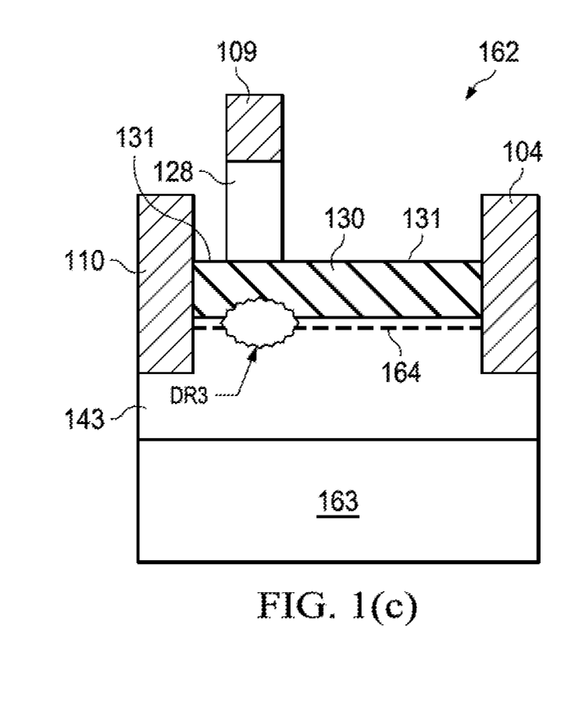
FIG. 1(c) depicts another cross-sectional side-view of the enhancement mode normally-off GaN-based transistor, in accordance with various examples.

Referring now to FIG. 1(b), the cross-sectional side view 142, which depicts the p-type drain contact structure 145. The cross-sectional side view 142 depicts a substrate 163, which can include silicon, silicon carbide, sapphire, gallium nitride-based substrate or other suitable substrate material or substrate consisting of multiple materials. In examples where silicon based substrate is employed, the substrate 163 has a seed layer (not expressly shown) deposited on it. The seed layer (e.g., aluminum nitride) is necessary for the subsequent growth of a heterostructure, which, in the example shown here is formed by a GaN layer 143 and the AlGaN layer 130. In examples where gallium-based substrate is employed, growing the heterostructure may not require the seed layer. In some examples, the GaN layer 143 may be doped with carbon, iron, magnesium and/or some other suitable dopant. The AlGaN layer 130 can be derived from a general form of a GaN-based alloy comprising: $Al(X)In(Y)Ga(1-X-Y)N$, where X and Y are the concentrations of Aluminum and Indium, respectively. In some examples, the AlGaN layer 130 may have a uniform composition. For example, a composition of $Al(0.3)Ga(0.7)N$ uniformly forming the AlGaN layer 130. In other examples, AlGaN layer 130 may have a graded composition of Aluminum, Gallium, and Indium. For example, different compositions, such as Al(0.2)Ga(0.8)N; Al(0.1)Ga(0.9)N, form the AlGaN layer 130.

The cross-sectional side view 142 shows the AlGaN layer 130 having a top side 131, which is sometimes referred to as top surface 131. In some examples, the thickness of AlGaN layer 130 can be in the range of few nanometers (e.g., 1 nm) to tens of microns (e.g., 20 microns). In some examples, the thickness of AlGaN layer 130 can be in the range of few nanometers (e.g., 1 nm) to hundreds of nanometers (e.g., 1000 nm). The cross-sectional side view 142 also depicts a contour 144 of the 2DEG 148. The cross-sectional side view 142 further depicts the source contact structure 110, the gate contact structure 109, and drain contact structures 104, 106. The cross-sectional side view 142 further depicts the p-GaN structure 128 that is positioned on the top side 131 and, in one example, contacts the AlGaN layer 130. In other examples, a Schottky contact can be formed. The gate contact structure 109 is positioned on the p-GaN structure 128. The p-GaN structure 128 enables the GaN-based transistor 100 to function in the enhancement mode as the presence of the p-GaN structure 128 depletes the electrons present in the contour 144 of the 2DEG 148 under the p-GaN structure 128. Due to this phenomenon, the GaN-based transistor 100 is considered normally OFF. The cross-sectional side view 142 further depicts the p-type drain contact structure 145 including the p-GaN block 124 and the drain contact structure 106. The drain contact structures 106, 104 couple to each other via the connecting wire 112.

The presence of the p-GaN block 124 and the p-GaN structure 128 depletes the electrons present in the contour 144 of the 2DEG 148 under both these layers. In other words, the p-GaN block 124 forms a depletion region DR2 in the contour 144 of the 2DEG 148 and the p-GaN structure 128 forms a depletion region DR1 in the contour 144 of the 2DEG 148. In some examples, the source and drain contact structures 110, 104 can be said to be supported by the GaN layer 143. The source and drain contact structures 110, 104, respectively, as shown in FIGS. 1(b), 1(c), extend into the GaN layer 143 and directly couple to the contour 144. However, in some examples, the source and drain contact structures 110, 104, respectively, may be fabricated such that they extend into the AlGaN layer 130 and couple to the contour 144 through quantum tunneling. In such examples, the source and drain contact structures 110, 104 can be said to be supported by the AlGaN layer 130. In other examples, the source and drain contact structures 110, 104, respectively, may be fabricated such that they form an ohmic contact with the AlGaN layer 130 and couple to the contour 144 through quantum tunneling. The ohmic contact is a low resistance junction that provides current conduction between the source contact structure 110 and the contour 144 and the drain contact structure 104 and the contour 144.

Referring now to FIG. 1(c), the cross-sectional side view 162, which is similar to the cross-sectional side view 142, except for the absence of the block of p-type drain contact structure 145. The cross-sectional side view 162 has a contour 164 of the 2DEG 148 formed at the interface of the AlGaN layer 130 and the GaN layer 143, and because of the absence of the p-type drain contact structure 145, the contour 164 of the 2DEG 148 is depleted just below the p-GaN structure 128, meaning that the p-GaN structure 128 forms a depletion region DR3 in the contour 164 of the 2DEG 148. It can be observed from the cross-sectional side views 142, 162 that the GaN-based transistor 100 has two contours of the 2DEG 148. The first contour of 2DEG 148, e.g., contour 144, is depleted at more than one position because of the presence of multiple pGaN structures. Whereas, the second contour of 2DEG 148, e.g., contour 164, is depleted at just one position. The arrangement of p-type drain contact structures similar to the p-type drain contact structure 145 on the AlGaN layer 130 enables the formation of multiple of these first and second contours of 2DEG 148 at the interface of the AlGaN layer 130 and the GaN layer 143. It is further observed by the inventors that using such an arrangement reduces the current collapse phenomenon and that the fabrication of the block-based hybrid drain contact structure circumvents the need of having different thicknesses of the AlGaN layer 130, which enables saving fabrication costs as the epitaxial growth process is performed only once.

Figure 2A:
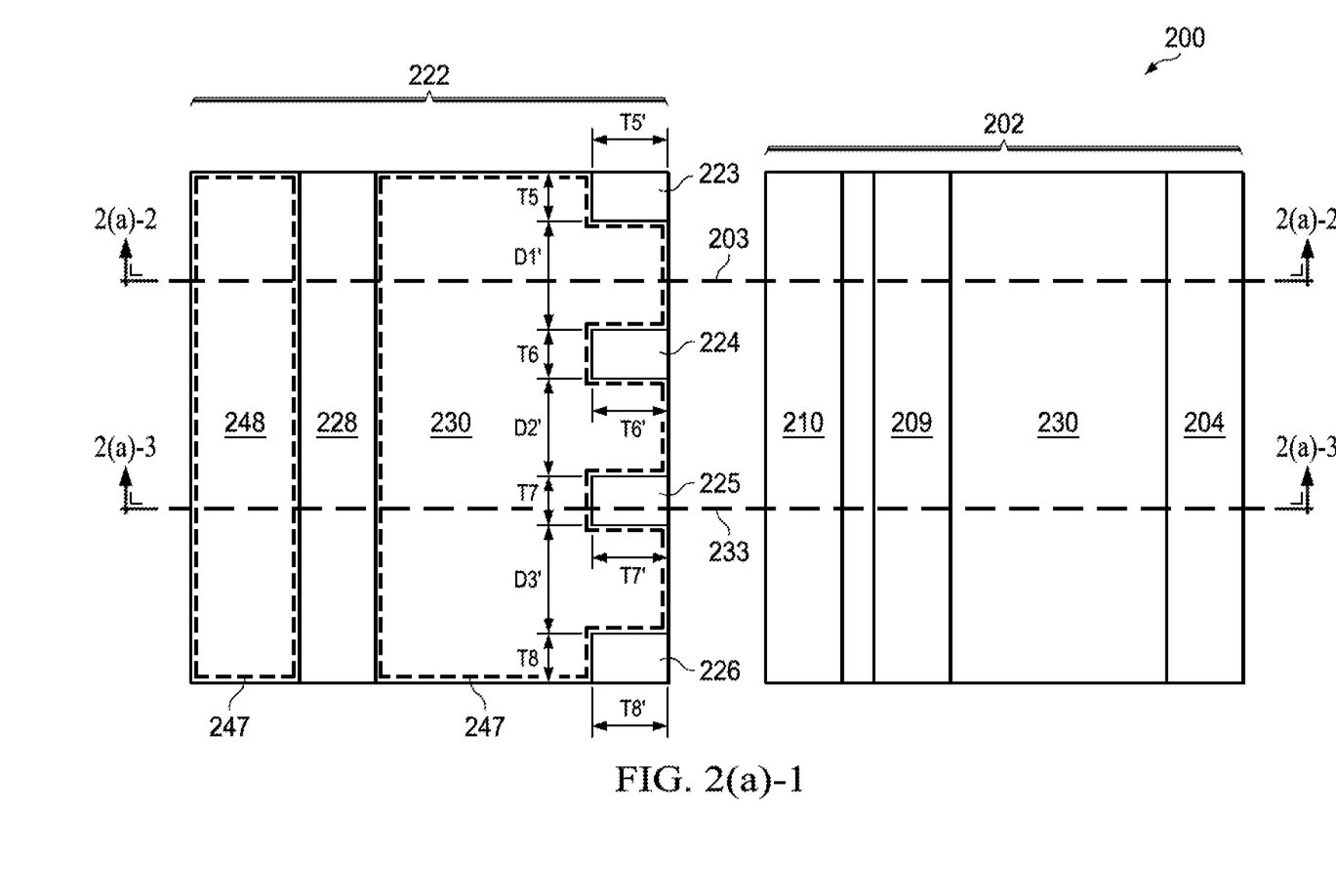

Referring now to FIG. 2(a)-1, an illustrative representation depicting top-down views 202, 222 of an enhancement mode normally-off GaN-based transistor 200 that implements another example of the block-based hybrid drain contact structure is shown. FIG. 2(a)-2 and FIG. 2(a)-3 depict cross-sectional side-views 262, 242 of the enhancement mode normally-off GaN-based transistor 200 along the lines 203, 233, respectively. The enhancement mode normally-off GaN-based transistor 200 is hereinafter referred to as GaN-based transistor 200. The block-based hybrid drain contact structure depicted in FIG. 2(a)-1 is similar to the modified hybrid drain contact structure depicted in FIG. 1(a), except for the position of the p-GaN blocks 223, 224, 225, and 226, which, in FIG. 2(a)-1, are disposed underneath the drain contact layer 204 as opposed to the p-GaN blocks 123, 124, 125, and 126 that were positioned along with the drain contact layer 104. The illustrative block-based hybrid drain contact structure of FIG. 2(a)-1 also improves (e.g., reduces) the current collapse. The fabrication of the block-based hybrid drain contact structure circumvents the need of having different thicknesses of an AlGaN layer 230, which also enables saving fabrication costs as the epitaxial growth process is performed only once.

The top-down view 202 depicts a source contact structure 210, a gate contact structure 209, and a drain contact structure 204. Refer now to the top-down view 222, which depicts the layers present in the GaN-based transistor 200 underneath the contact structures depicted in the top-down view 202. The top-down view 222 depicts a p-doped GaN structure 228 (or p-GaN structure 228) that enables the GaN-based transistor 200 to function in a normally-off (or enhancement) mode.

From a fabrication standpoint, the p-GaN structure 228 is positioned under the gate contact structure 209. The top-down view 222 further depicts p-GaN blocks 223, 224, 225, and 226, which, from a fabrication standpoint, are positioned underneath the drain contact structure 204. The p-GaN blocks 223, 224, 225, 226, and the p-GaN structure 128 are supported by the AlGaN layer 230.

Figure 2A:
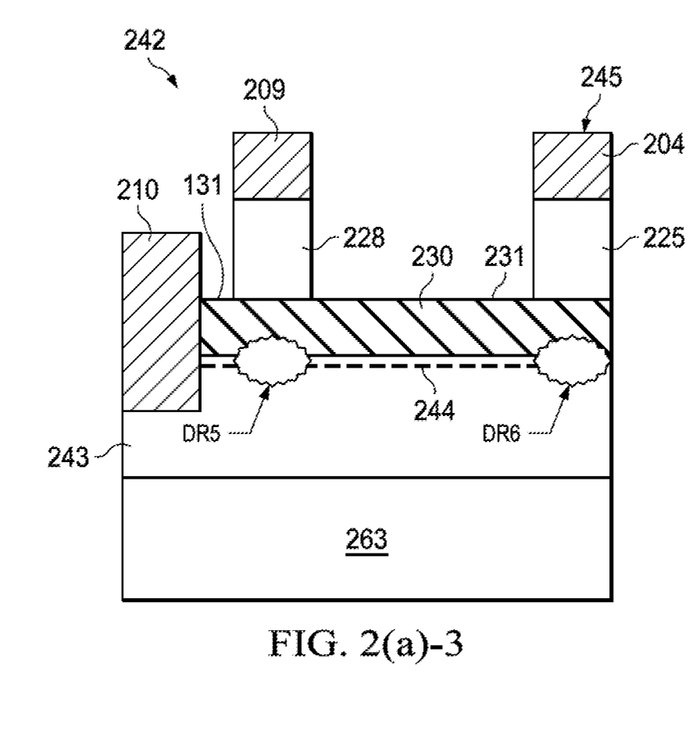

The combined arrangement of the drain contact structure 204 and the p-GaN block 225 forms a p-type drain contact structure 245 (briefly refer to the cross-sectional side view 242). The combined arrangement of the drain contact structure 204 and the p-GaN block 223 forms another p-type drain contact structure (not expressly shown in FIG. 2(a)-1). Similarly, the combined arrangement of the drain contact structure 204 and the p-GaN block 225 forms yet another p-type drain contact structure (not expressly shown). Similarly, the combined arrangement of the drain contact structure 204 and the p-GaN block 226 forms yet another p-type drain contact structure (not expressly shown). Thus, the GaN-based transistor 200 includes the block-based hybrid drain contact structures formed from p-type drain contact structures mentioned above.

In some examples, the p-GaN blocks 223, 224, 225, and 226 have lengths T5, T6, T7, and T8, respectively. The top-down view 222 depicts the p-GaN blocks 223, 224, 225, and 226 having equal lengths. In other examples, the lengths T5, T6, T7, and T8 may be unequal. In some examples, the p-GaN blocks 223, 224, 225, and 226 have widths T5', T6', T7', and T8', respectively. The top-down view 222 also depicts the p-GaN blocks 223, 224, 225, and 226 having equal widths. In other examples, the widths T5', T6', T7', and T8' may be unequal. In some examples, the widths of the drain contact structure 204 may be similar to the widths of the p-GaN blocks 223-226. However, in other examples, the thickness of the drain contact structure 204 is different (e.g., smaller) than the thickness of the p-GaN blocks 223-226. Briefly refer to FIG. 2(b), which depicts top-down views of another gallium nitride-based transistor 200' that implements a block-based hybrid drain contact structure. The GaN based transistor 200' includes p-GaN blocks 223-226, where each of the blocks has a thickness greater than the thickness of the drain contact layer 204. For example, the p-GaN blocks 223-226 have widths T11, T13, T15, and T17 that are greater than the thickness of the drain contact layer 204. From a fabrication standpoint, having different widths may mean that the drain contact layer 204 does not completely overlap the p-GaN blocks 223-226. A distance D4 is the distance between the central axes of the p-GaN blocks 223, 224; a distance D5 is the distance between the central axes of the p-GaN blocks 224, 225; a distance D6 is the distance between the central axes of the p-GaN blocks 225, 226. Still referring to FIG. 2(b), the p-GaN blocks 223-226 assume a hexagonal shape. However, in other examples, the p-GaN blocks 223-226 may assume any arbitrary shape.

Referring back to FIG. 2(a)-1, the p-GaN blocks 223-226 are depicted to be placed at a finite distance from each other. For example, the blocks 223, 224 are at a first distance, D1', from each other, where D1' is the distance between the lower edge of the block 223 and the upper edge of the block 224. The blocks 224, 225 are at a second distance, D2', from each other, where D2' is the distance between the lower edge of the block 224 and the upper edge of the block 225. Similarly, the blocks 225, 226 are at a third distance, D3', from each other, where D3' is the distance between the lower edge of the block 225 and the upper edge of the block 226. These distances D1, D2, D3, in some examples, are equal. However, in other examples, these distances may be unequal.

Figure 2A:
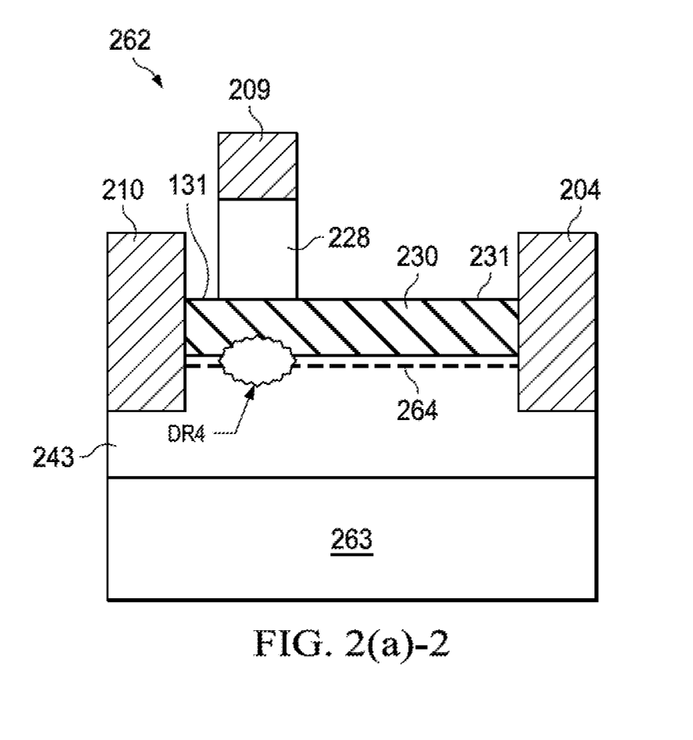
Figure 2B:
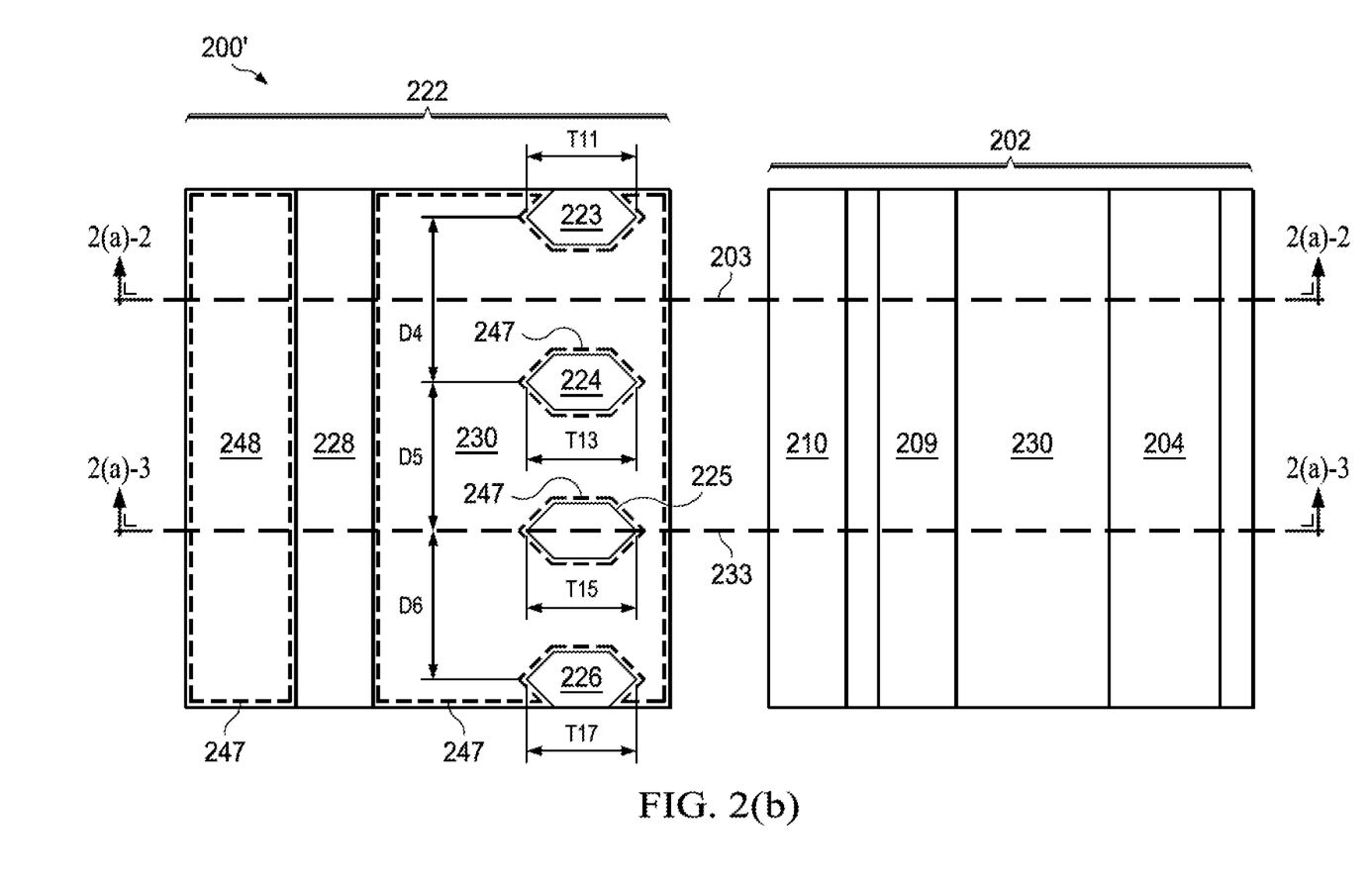
FIG. 2(b) depicts top-down views of yet another illustrative gallium nitride-based transistor that implements the block-based hybrid drain contact structure, in accordance with various examples.

In the examples shown in FIGS. 2(a)-1, 2(b), the p-GaN blocks 223, 224, 225, and 226, in combination with the drain contact layer 204, form the block-based hybrid drain contact structure in FIGS. 2(a)-1, 2(b). The top-down view 222 (in both FIGS. 2(a)-1, and 2(b)) depicts dotted lines marked with a numeral 247. A 2DEG 248 is formed near the interface of the GaN layer 243 and the AlGaN layer 230 and is present below the AlGaN layer 230 in between the boundary marked by the dotted lines 247.

Referring now to the cross-sectional side views 242, 262 of the GaN-based transistor 200. The cross-sectional side view 242 is along the line 233 and depicts the p-type drain contact structure 245, whereas the cross-sectional side-view 262 is along the line 203 and depicts the cross-sectional side-view of the portion between p-type drain contact structures formed by: the drain contact structure 204, the p-GaN block 223; and the drain contact structure 204 and the p-GaN block 224.

The description of the substrate 163, GaN layer 143, and AlGaN layer 130 of FIG. 1(a) applies to the substrate 263, GaN layer 243, and AlGaN layer 230, respectively, of FIG. 2(a)-1. The cross-sectional side views 242, 262 shows the AlGaN layer 230 having a top side 231, which is sometimes referred to as top surface 231. The cross-sectional side view 242 depicts a contour 244 of the 2DEG 248.

The cross-sectional side view 242 further depicts the source contact structure 210, the gate contact structure 209, and drain contact structure 204. The cross-sectional side view 242 further depicts the p-GaN structure 228 that is positioned on the top surface 231 and forms, in one example, an ohmic contact with the AlGaN layer 230. In other examples, a Schottky contact can be formed. The gate contact structure 209 is positioned on the p-GaN structure 228. The p-GaN structure 228 enables the GaN-based transistor 200 to function in the enhancement mode as the presence of the p-GaN structure 228 depletes the electrons present in the contour 244 of the 2DEG 248 under the p-GaN structure 228. Due to this phenomenon, the GaN-based transistor 100 is considered normally OFF. The cross-sectional side view 242 further depicts the p-type drain contact structure 245 including the p-GaN block 225 and the drain contact structure 204.

The presence of the block of p-GaN block 225 and the pGaN structure 228 depletes the electrons present in the 2DEG 248 under both the structures. Contour 244 includes depletion regions DR5, DR6, which depict the depleted electrons from the 2DEG 248 underneath the block of p-GaN block 225 and the p-GaN structure 228. The source and drain contact structures 210, 204, respectively, as shown in the cross-sectional view 242, extend into the GaN layer 243 and directly couple to the contour 244. In such examples, the source and drain contact structures 210, 204 can be said to be supported by the GaN layer 243. However, in some examples, the source and drain contact structures 210, 204, respectively, may be fabricated such that they extend into the AlGaN layer 230 and couple to the contour 244 through quantum tunneling. In such examples, the source and drain contact structures 210, 204 can be said to be supported by the AlGaN layer 230. In other examples, the source and drain contact structures 210, 204, respectively, may be fabricated such that they form an ohmic contact with the AlGaN layer 230 and couple to the contour 244 through quantum tunneling.

Referring now to the cross-sectional side view 262. The description of the cross-sectional side view 242 applies to the cross-sectional side view 262, except for the absence of the p-type drain contact structure 245. The absence of the p-type drain contact structure 245 only depletes electrons in the 2DEG 248 below the p-GaN structure 228, and a depletion region DR4 depicts the depleted electrons from a contour 264 of the 2DEG 248. It can again be observed from the cross-sectional side views 242, 262 that the GaN-based transistor 200 has two contours of 2DEGs. The first contour of 2DEG 248, e.g., contour 244, is depleted at more than one position because of the presence of multiple pGaN structures, such as the pGaN structure 228 and the p-GaN block 225. Whereas, the second contour of 2DEG, e.g., contour 264, is depleted at just one position because of the presence of just the pGaN structure 228. Thus, the presence of the block of p-type drain contact structure 245 (or the block of pGaN structure 225) results in an additional depleted region/position in the contour 244.

The presence of multiple p-type drain contact structures on the AlGaN layer 230 enables the formation of multiple of these first and second type of 2DEGs at the interface of the AlGaN layer 230 and the GaN layer 243. It is observed by the inventors that using such an arrangement reduces the current collapse phenomenon and that the fabrication of the block-based hybrid drain contact structure circumvents the need of having different thicknesses of the AlGaN layer 230, which enables saving fabrication costs as the epitaxial growth process is performed only once.

Figure 3A:
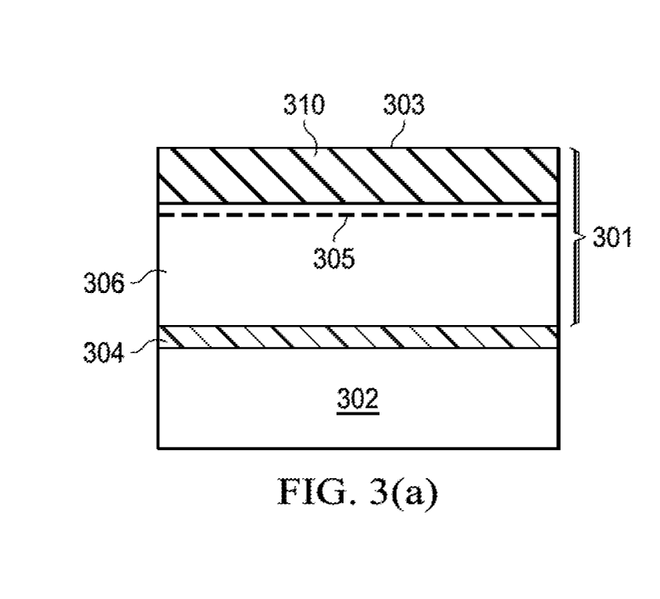
FIGS. 3(a)-3(d) are illustrative flow diagrams depicting cross-sectional side views of an illustrative gallium nitride-based transistor, in accordance with various examples.
Figure 3B:
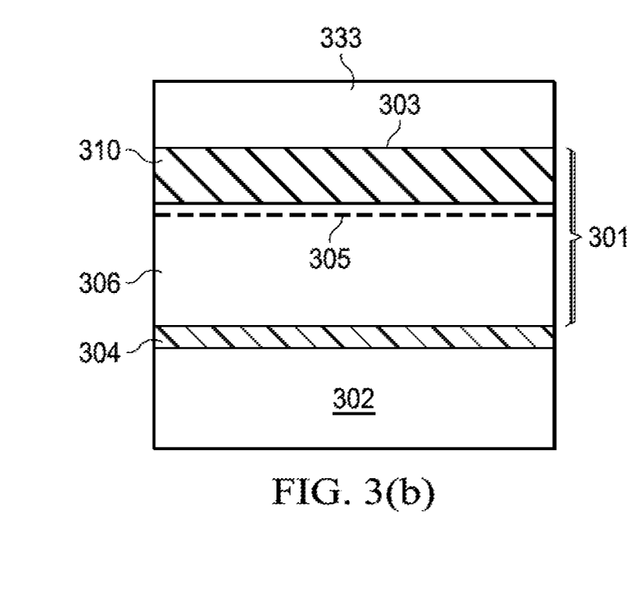
Figure 4A:
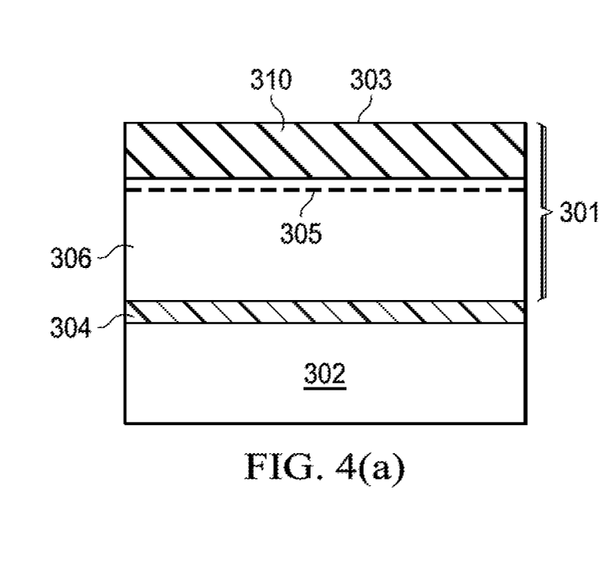
FIGS. 4(a)-4(d) are illustrative flow diagrams depicting cross-sectional side views of an illustrative gallium nitride-based transistor, in accordance with various examples.
Figure 4B:
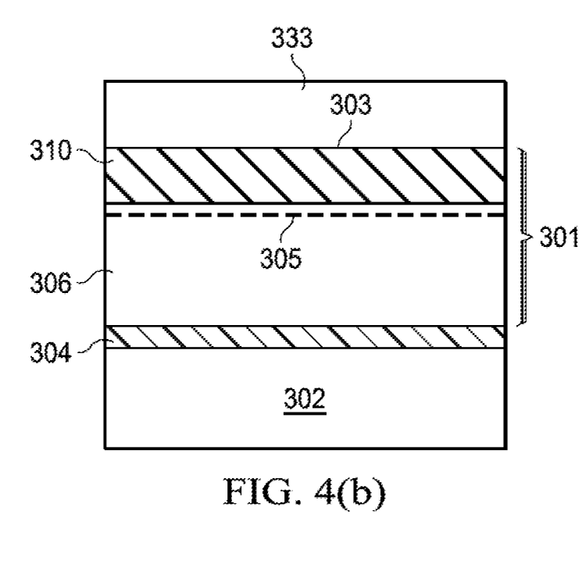
Figure 4C:
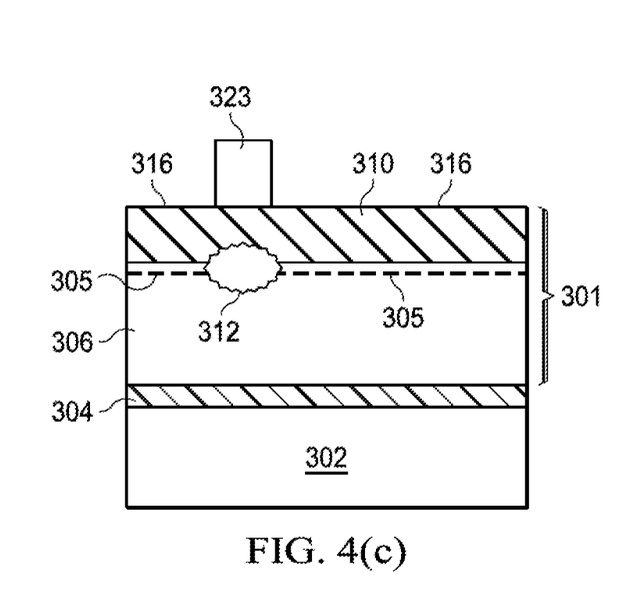
Figure 4D:
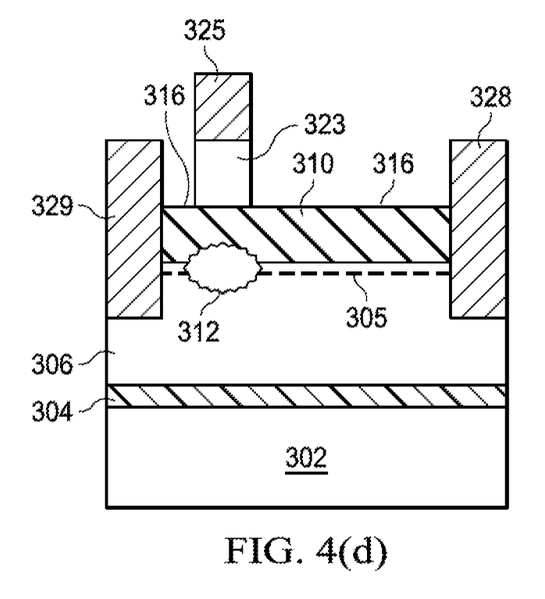
Figure 5:
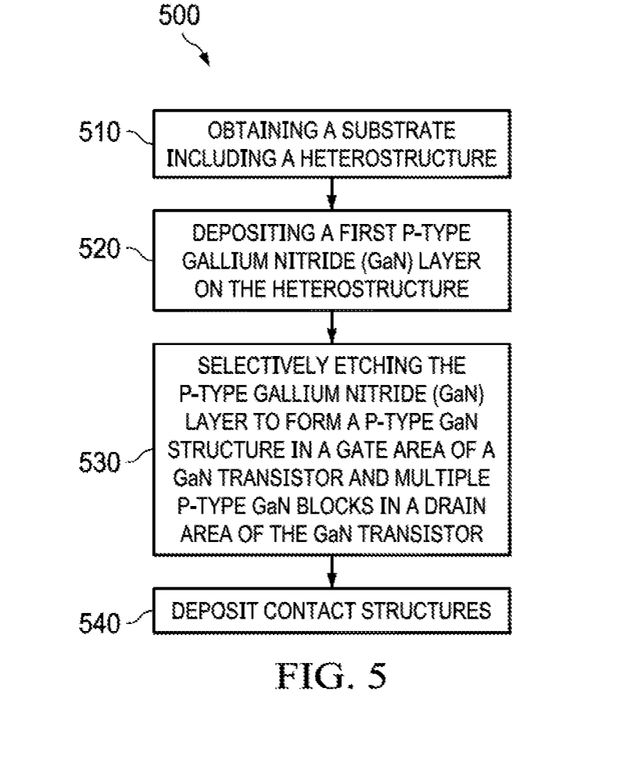
FIG. 5 depicts an illustrative method to fabricate a gallium nitride-based transistor that implements the block-based hybrid drain contact structure, in accordance with various examples.

FIG. 5 depicts an illustrative method 500 to fabricate an enhancement mode normally-off GaN-based transistor 300 that is similar to the GaN-based transistor 100, which implements the block-based hybrid drain contact structure, as described in FIGS. 1(a), 1(b), and 1(c). FIGS. 3(a)-3(d) are illustrative flow diagrams depicting cross-sectional side views—along the line 103 and FIGS. 4(a)-4(d) are illustrative flow diagrams depicting cross-sectional side views—along the line 133—while the method 500 is performed to fabricate the GaN-based transistor 100. The method 500 is now described in tandem with FIGS. 3(a)-3(d) and FIGS. 4(a)-4(d).

The method 500 begins with obtaining a substrate 302 including a heterostructure 301 (step 510; FIGS. 3(a) and 4(a)). The heterostructure 301 is supported by the substrate 302. The heterostructure 301 is grown on the seed layer 304 using chemical vapor deposition, or using other suitable deposition processes. For illustration sake, it is assumed that the substrate 302 includes silicon. The heterostructure 301, in some examples, includes the GaN layer 306 and the AlGaN layer 310, where the AlGaN layer 310, having the top side 303, is grown on the GaN layer 306. FIG. 3(a) and FIG. 4(a) further depicts the 2DEG 305 formed at the AlGaN 310/GaN 306 interface. AlGaN layer 310 forms when aluminum nitride (AlN) is formed, in one example, using metal organic chemical vapor deposition on the GaN layer 306.

The method 500 then proceeds to step 520 (FIG. 3(b)) that includes depositing a p-doped GaN layer 333 (hereinafter p-GaN layer 333) on the top side 303. For illustration sake, p-GaN layer 333 is assumed to be doped with magnesium. The p-GaN layer 333 may be fabricated by, first growing a GaN layer using molecular beam epitaxy (or other suitable processes) and then adding p-type dopants, e.g., magnesium. In other examples, a suitable dopant, such as Mg, may be added during the growth of the GaN layer. In other examples, other suitable dopants may be used. Because of the presence of pGaN layer 333, 2DEG 305 is depleted from the AlGaN layer 310/GaN layer 306 interface.

Figure 3C:
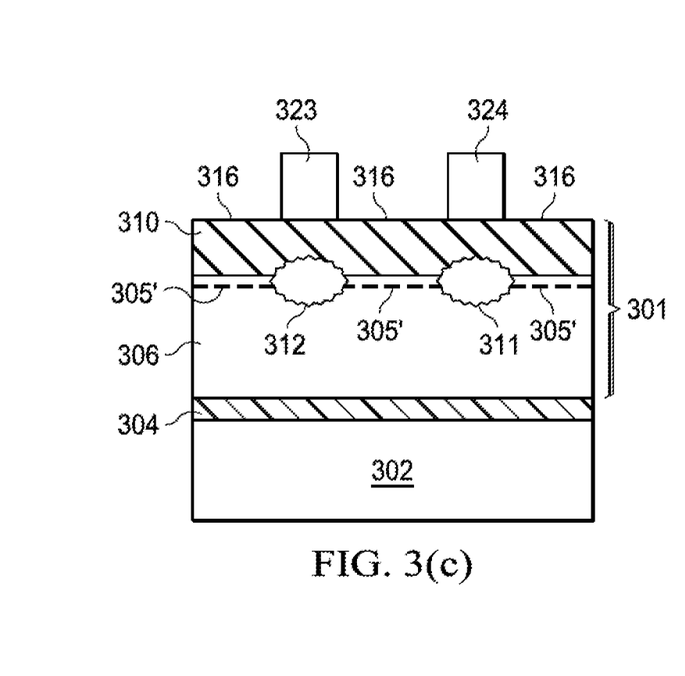

The method 500 then proceeds to step 530 (FIG. 3(c)) that includes selectively etching the pGaN layer 333 to form a p-GaN structure 323 (similar to p-GaN structure 128 of FIG. 1(a)) in a gate area of the GaN-based transistor 300 and a p-GaN block 324 (similar to pGaN structure 124 of FIG. 1(b)) in a drain area of the GaN-based transistor 300. FIG. 3(c) depicts a single block of p-GaN block; however, the step 530 forms multiple of these blocks. The gate and drain areas are areas in which a gate and a drain (respectively) for the GaN-based transistor 300 will form in subsequent steps. The p-GaN structure 323 and the p-GaN block 324 are supported by the heterostructure 301. The p-GaN structure 323 enables the GaN-based transistor 300 (being fabricated using method 500) to function in the enhancement mode. It can be observed that 2DEG 305 is depleted (see the portion marked by the numeral 312 in FIG. 4(c)) from the AlGaN layer 310/GaN layer 306 interface under the pGaN layer 323. It can also be observed that 2DEG 305 is depleted from multiple portions (see the portion marked by the numerals 311 and 312 in FIG. 3(c)) from the AlGaN layer 310/GaN layer 306 interface under the p-GaN block 324 and the pGaN structure 323. Stated another way, the selective etching of the pGaN layer 333 forms the pGaN structure 323 and p-GaN block 324 such that contour 305' of 2DEG has multiple depletion regions, and contour 305 of 2DEG has one depletion region. Following step 530, the method 500 proceeds to step 540 that includes depositing, using for instance a metal-deposition process (sputter, evaporation, etc.), a block of a drain contact structure 326 (FIG. 3(d)) and a drain contact structure 328 (FIGS. 3(d) and 4(d)), a gate contact structure 325 (FIGS. 3(d) and 4(d)), and a source contact structure 329 (FIGS. 3(d) and 4(d)).

Figure 3D:
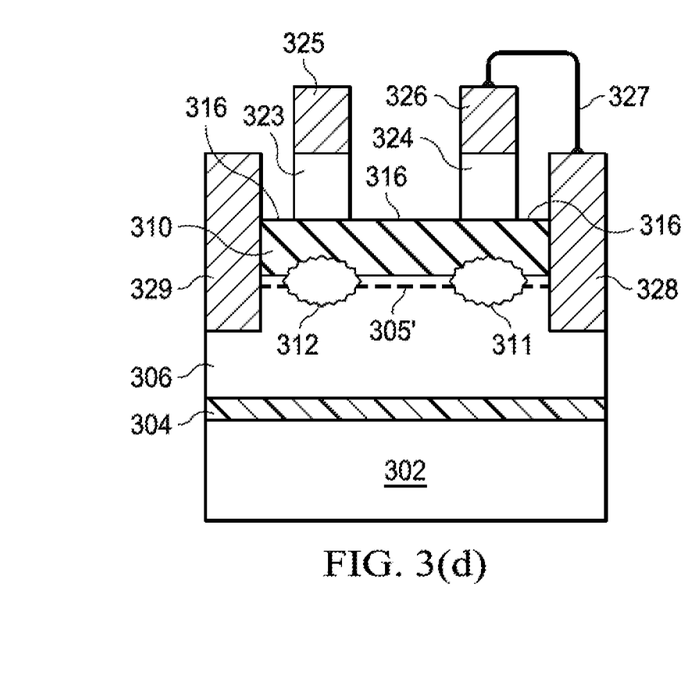

The example shown in FIGS. 3(d) and 4(d) depicts the source contact structure 329 and the drain contact structure 328 extending from the top side 316 into the GaN layer 306. In such an example, prior to step 540, the AlGaN layer 310 and the GaN layer 306 may be etched using a mask layer and an etching process. The mask layer (not expressly shown) may be a dry film or a photoresist film covered on the top surface 316 through a suitable coating process, which may be followed by curing, descum, and the like, further followed by lithography technology and/or etching processes, such as a dry etch and/or a wet etch process, to form etched regions where the source and drain contact structures 329, 328, respectively, are deposited. In some examples, the source and drain contact structures 329, 328, respectively, may be fabricated such that they extend into the AlGaN layer 310 and couple to the 2DEGs 305, 305' through quantum tunneling. In other examples, the source and drain contact structures 329, 328, respectively, may be fabricated such that they form an ohmic contact with the AlGaN layer 310 and couple to the 2DEGs 305, 305' through quantum tunneling. The source and drain contact structures 329, 328 can be said to be supported by the heterostructure 301. The gate contact structure 325 is deposited such that it is supported by the p-GaN structure 323. Whereas the block of the drain contact structure 326 is supported by the p-GaN block 324. The method 500 so far describes the method to fabricate the block-based hybrid contact structure of FIG. 1(a).

However, the method 500 can be adapted to fabricate the block-based hybrid contact structure shown in FIG. 2(a)-1, which omits the block of the drain contact structure 326 and implements the block-based hybrid contact structure by depositing the drain contact structure 328 on the p-GaN block 324. The step 540 can further be adapted to attain the structure depicted in FIG. 2(a)-1. For example, with the adapted step 540, the source contact structure 329 extends from the top side 316 into the GaN layer 306; the gate contact structure 325 is deposited such that it is supported by the p-GaN structure 323; and the drain contact structure 328 is supported by the block of the p-GaN block 324.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A gallium nitride (GaN)-based transistor, comprising:
   a substrate;
   a GaN layer supported by the substrate;
   an aluminum nitride gallium (AlGaN) layer supported by the GaN layer;
   a p-doped GaN structure supported by the AlGaN layer; and
   a source contact structure supported by the AlGaN layer;
   a first drain contact structure supported by the AlGaN layer;
   multiple p-doped GaN blocks supported by the AlGaN layer and located between the p-doped GaN structure and the first drain contact structure, each of the multiple p-doped GaN blocks physically separated from the remaining multiple p-doped GaN blocks;
   wherein first and second contours of a two-dimensional electron gas (2DEG) of the GaN-based transistor are at an interface of the AlGaN and GaN layers.

2. The GaN-based transistor of claim 1 further comprising:
   multiple second drain contact structures located between the p-doped GaN structure and the first drain contact structure, each of the multiple second drain contact structures physically separated from the remaining second drain contact structures, and each of the multiple second drain contact structures disposed on a different one of the multiple p-doped GaN blocks, wherein each of the multiple second drain contact structures electrically couples to the first drain contact structure; and
   a gate contact structure disposed on the p-doped GaN structure.

3. The GaN-based transistor of claim 2, wherein the second contour of the 2DEG has first and second depletion regions, wherein the first depletion region is positioned below the p-doped GaN structure, and wherein the second depletion region is positioned below one of the multiple p-doped GaN blocks.

4. A gallium nitride (GaN)-based transistor, comprising:
   a substrate;
   a GaN layer supported by the substrate;
   an aluminum nitride gallium (AlGaN) layer supported by the GaN layer;
   a p-doped GaN structure supported by the AlGaN layer;
   a source contact structure supported by the AlGaN layer;
   a drain contact structure disposed on the multiple p-doped GaN blocks;
   a gate contact structure disposed on the p-doped GaN structure; and
   multiple p-doped GaN blocks supported by the AlGaN layer, each of the multiple p-doped GaN blocks physically separated from the remaining multiple p-doped GaN blocks, wherein a linear portion of the drain contact structure overlies the multiple p-doped GaN blocks;
   wherein first and second contours of a two-dimensional electron gas (2DEG) of the GaN-based transistor are at an interface of the AlGaN and GaN layers.

5. The GaN-based transistor of claim 1, wherein the first contour of the 2DEG has a single depletion region, wherein the second contour of 2DEG has two depletion regions.

6. The GaN-based transistor of claim 1, wherein a first consecutive pair of the multiple p-doped GaN blocks is at a first distance from each other and a second consecutive pair of the multiple p-doped GaN blocks is at a second distance from each other.

7. The GaN-based transistor of claim 6, wherein the first and second distances are equal.

8. The GaN-based transistor of claim 1, wherein one of the multiple p-doped GaN blocks has a first thickness and a first length, wherein another one of the multiple p-doped GaN blocks has a second thickness and a second length.

9. The GaN-based transistor of claim 8, wherein the first length equals the second length, and the first thickness equals the second thickness.

10. The GaN-based transistor of claim 4, wherein the second contour of the 2DEG has a first depletion region below the drain contact structure and a second depletion region below the gate contact structure.

11. A gallium nitride (GaN)-based transistor, comprising:
    a substrate;
    a GaN layer supported by the substrate;
    an aluminum nitride gallium (AlGaN) layer supported by the AlGaN layer;
    a p-doped GaN layer supported by the AlGaN layer;
    a gate contact structure disposed on the p-doped GaN layer;
    a first drain contact structure disposed on the AlGaN layer;
    multiple p-doped GaN blocks disposed on the AlGaN layer, wherein the multiple p-doped GaN blocks are located between the p-doped GaN layer and a same linear portion of the first drain contact structure;
    multiple second drain contact structures, each of the multiple second drain contact structures physically separated from the remaining second drain contact structures, and each of the multiple second drain contact structures disposed on a different one of the multiple p-doped GaN blocks, wherein each of the multiple second drain contact structures electrically couples to the first drain contact structure; and
    a source contact structure disposed on the AlGaN layer.

12. The GaN-based transistor of claim 11, wherein the AlGaN layer has a chemical composition of $Al(X)In(Y)Ga(1-X-Y)N$, wherein X and Y are concentrations of aluminum and Indium, respectively.

13. The GaN-based transistor of claim 11, wherein a first contour of a two dimensional electron gas (2DEG) of the GaN-based transistor is present below the p-doped GaN structure, wherein a second contour of the 2DEG is present below the first p-doped GaN structure and at least one of the multiple p-doped GaN blocks.

14. The GaN-based transistor of claim 11, wherein a first contour of the 2DEG has a first depletion region, wherein a second contour of the 2DEG has second and third depletion regions.

15. The GaN-based transistor of claim 11, wherein a first consecutive pair of the multiple p-doped GaN blocks is at a first distance from each other and a second consecutive pair of the multiple p-doped GaN blocks is at a second distance from each other.

16. The GaN-based transistor of claim 6, wherein the first and second distances are equal.

\* \* \* \* \*